United States Patent [19]

Lannan

[11] 4,388,591
[45] Jun. 14, 1983

[54] SELF-SEALING TEST PROBE

[75] Inventor: Patrick E. Lannan, Harrisburg, Pa.

[73] Assignee: AMP Incorporated, Harrisburg, Pa.

[21] Appl. No.: 219,120

[22] Filed: Dec. 22, 1980

[51] Int. Cl.³ .......................................... G01R 31/22
[52] U.S. Cl. ................................ 324/158 P; 141/329;
                                              324/149; 339/108 TP
[58] Field of Search .................... 324/158 P, 72.5, 149,
        324/65 P, 62 R; 339/108 TP, 31 T; 141/329

[56] References Cited
U.S. PATENT DOCUMENTS

| | | | |
|---|---|---|---|
| 467,891 | 1/1892 | Neu | 324/72.5 UX |
| 1,138,749 | 5/1915 | Green | 141/329 X |
| 2,529,270 | 11/1950 | Webster | 324/72.5 UX |
| 2,819,573 | 1/1958 | Whittington | 141/329 X |
| 3,768,005 | 10/1973 | Louks | 324/72.5 X |
| 4,098,048 | 7/1978 | Sawa | 141/329 |
| 4,166,457 | 9/1979 | Jacobsen et al. | 128/639 |

FOREIGN PATENT DOCUMENTS 365124 7/1930 United Kingdom ................. 141/329

*Primary Examiner*—Stanley T. Krawczewicz
*Assistant Examiner*—Jose M. Solis
*Attorney, Agent, or Firm*—Adrian J. LaRue; Gerald K. Kita

[57] ABSTRACT

The disclosure relates to a self-sealing test probe for use in measuring the resistance between a point within an insulated wire and some external point without degrading the conductor insulation integrity. This is accomplished by utilizing a probe in the form of a hypodermic needle, the needle being electrically conductive and being coupled through appropriate circuitry to appropriate metering to determine resistance. The hypodermic is loaded with an appropriate nonelectrically conductive adhesive which, upon and during removal of the probe from the insulation, forces the adhesive through the hollow portion of the probe into the aperture in the insulation formed by the probe, thereby filling the aperture with the adhesive or sealant to fill the pinhole or void caused by the needle penetration. The amount of sealant injected can be preset or automatically metered.

6 Claims, 2 Drawing Figures

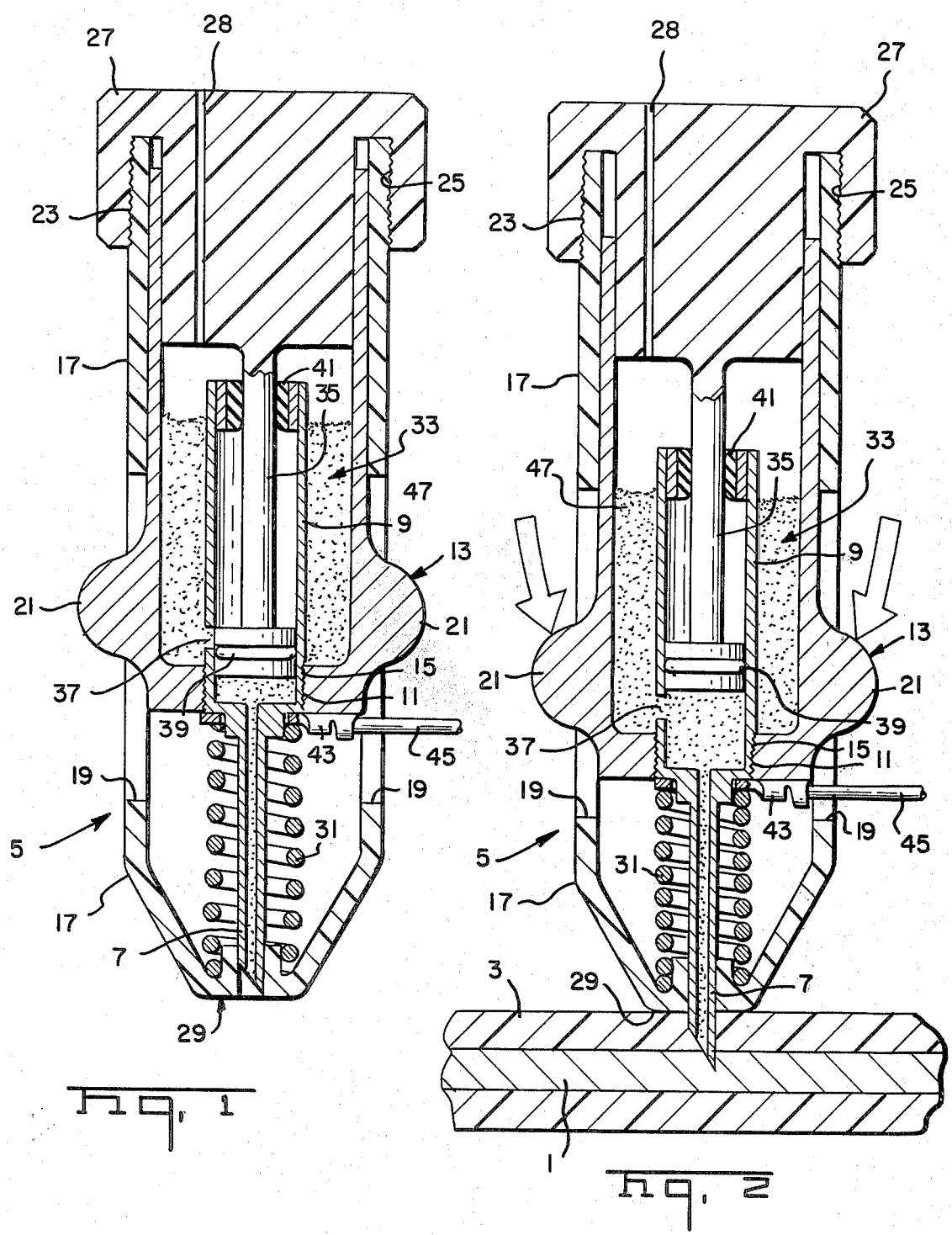

SELF-SEALING TEST PROBE

BACKGROUND OF THE INVENTION

1. Field of the Invention

This invention relates to a probe which is capable of piercing the insulation of an electrical wire to contact the wire therein and seal the pinhole formed by insertion of the probe during probe removal to assure conductor insulation integrity after a test has been completed.

2. Description of the Prior Art

Electrical test probes have been used in the prior art, such probes being capable of piercing insulation making contact with the electrical conductor therewithin. This prior art has either never recognized the problem that the integrity of the insulation was compromised due to the holes left after probe removal or, if the problem was recognized, no solution thereto has ever been provided. Such prior art probes are set forth in the patents to Kraft Nos. (2,580,682), Adams (3,693,087), Esty (4,014,330) and Teyler (4,151,462), these patents being representative of the known prior art. Jacobsen (4,166,457) discloses self sealing of a bioelectrode.

SUMMARY OF THE INVENTION

In accordance with the present invention, the problems of the prior art are overcome and insulation resistance and the integrity thereof are maintained, despite the application of a test probe through the wire insulation to contact the wire therein. This is provided by the use of a probe in the form of a hypodermic syringe, the needle portion being hollow and electrically conductive, which penetrates through the insulation, contacts the wire and makes electrical contact therewith. The needle is connected electrically to an external line to provide the proper connection to appropriate test instruments. The test probe is connected to a syringe which, after the electrical measurement has been taken and during withdrawal of the probe, injects a sealant into the hole formed by the penetration of the probe, whereby the sealant adheres to the insulation within the hole formed and maintains the electrical integrity of the insulation. The syringe can be arranged to meter out a predetermined amount of sealant or, alternatively, markings on the syringe itself can provide an indication as to the amount of sealant being dispensed.

BRIEF DESCRIPTION OF THE DRAWING

FIG. 1 is a cross-sectional view of a test probe in accordance with the present invention with the probe in the retracted state; and FIG. 2 is a cross-sectional view of the test probe of FIG. 1 in the extended position.

DESCRIPTION OF THE PREFERRED EMBODIMENT

Referring now to the drawings, there is shown in FIG. 2 a wire having a conductor 1 surrounded by insulation 3. A self-sealing test probe 5 is shown in FIGS. 1 and 2 having a hypodermic needle type dispenser 7 which is formed of electrically conductive material and has a hollow interior. The needle 7 includes a barrel portion 9 of electrically conductive material with a threaded region 11 at the bottom portion of the barrel. A needle housing 13 having threads 15 threadedly engages the threads 11 and holds the needle 7 therein. The needle housing 13 is slidably secured within an outer resilient band 17 having an opening 19 therein through which ears 21 of the needle housing 13 extend. The upper portion of the band 17 includes an external thread 23 which threadedly engages threads 25 on cap 27.

The bottom portion of the needle housing 13 receives one end of a spring member 31, the other end of which is secured to the bottom portion of the resilient band 17. The resilient band 17 include an apertures 29 at its bottom portion through which the needle 7 passes, the needle being disposed within the spring 31.

The cap 27, in conjunction with the needle housing 13 and the barrel portion 9 of the needle form a reservoir 33 for storing of sealant 47. A plunger 35 is provided, the top end of which is secured in or integral with the cap 27, the other forward or bottom end being disposed in the barrel portion 9 of the needle for pumping sealant through the needle in a manner as will be explained hereinbelow. A vent hole 28 through cap 27 allows atmospheric pressure to enter reservoir 33. The barrel portion 9 includes an aperture 37 therein which communicates with the reservoir 33 and permits sealant to enter into the bottom portion of the barrel. The plunger 35 includes a bottom portion enlarged area 39 which includes an O-ring that sealingly engages the interior of the barrel 9 to prevent sealant from travelling up the barrel. The rear or top portion of the plunger sealingly engages an O-ring 41 secured within the barrel to prevent sealant from entering the barrel from its top region.

A wire 45 is connected to a terminal 43 which is secured to the electrically conductive barrel 9. The wire extends through an aperture 19 in the resilient band 17 to provide an electrical circuit from the needle 7 through the barrel portion 9, the connection 43 and the wire 45 to an external device.

Referring now more specifically to FIG. 1, the probe is shown in the the retracted state. The barrel 9 has minimal sealant therein due to the position of the plunger in the barrel. The probe is then placed against a wire as shown in FIG. 2 and the ears 13 are moved in the direction of the wire (arrows in FIG. 2). The needle 7 will then pierce the insulation 3 and contact the wire 1 to make electrical connection therewith. As shown in FIG. 2, as the needle 7 and needle housing 13 move downwardly, the plunger 35 moves upward in the barrel 9, thereby exposing the aperture 37 and allowing sealant to flow from the reservoir 33 into the barrel. Upon retraction of the needle 7 from the wire, the ears 13 are moved upwardly in the band 17, thereby causing the plunger to move downwardly in the barrel, close the aperture 37 as shown and force the sealant out of the needle and into the hole formed in the insulation 3. The amount of sealant permitted to pass from the reservoir 33 into the barrel 9 is determined by the position of the plunger during needle insertion into the wire. Accordingly, the length of the plunger as well as the stroke length of the needle housing during needle insertion can be adjusted to meter a predetermined amount of sealant from the reservoir into the barrel.

Though the invention has been described with respect to a specific preferred embodiment thereof, many variations and modifications will immediately become apparent to those skilled in the art. It is therefore the intention that the appended claims be interpretedly as broadly as possible in view of the prior art to include all such variations and modifications.

What is claimed is:

1. A test probe of the type for penetrating insulation of an insulated electrical conductor to test the condition of the conductor core and for sealing the hole made in the insulation after the test has been completed, comprising:

housing means having reservoir means containing sealant means;

test probe means secured to said housing means, said test probe means including barrel means and hollow needle probe means, said barrel means having an aperture enabling said sealant means to enter said barrel means;

electrical conductor means connected to said test probe means;

mounting means in which said housing means is mounted to enable said housing means to move relative to said mounting means from a non-testing position to a testing position;

means sealing said aperture when said housing means is in said non-testing position;

means on said housing means for operating said housing means so that said housing means is moved relative to said mounting means from said non-testing position to said testing position thereby causing said hollow needle probe means to penetrate the insulation and make electrical contact with the electrical conductor core to test the condition thereof whereafter said housing means is moved back to said non-testing position causing said sealing means to express said sealant means from said barrel means along said hollow needle probe means into the hole formed in the insulation by the hollow needle probe means thereby sealing such hole.

2. A test probe as set forth in claim 1 wherein maintaining means is disposed between said housing means and said mounting means normally maintaining said housing means in said non-testing position.

3. A test probe as set forth in claim 2 wherein said maintaining means comprises spring means along which said hollow needle probe means extends.

4. A test probe as set forth in claim 1 wherein said sealing means comprises plunger means along which said barrel means moves to seal and unseal said aperture.

5. A test probe as set forth in claim 1 wherein said operating means comprise ear means extending through openings in said mounting means.

6. A test probe as set forth in claim 1 wherein a vent hole is located in said mounting means in communication with said reservoir means.

* * * * *